(12) United States Patent
Chen et al.

(10) Patent No.: US 7,052,946 B2
(45) Date of Patent: May 30, 2006

(54) METHOD FOR SELECTIVELY STRESSING MOSFETS TO IMPROVE CHARGE CARRIER MOBILITY

(75) Inventors: Chien-Hao Chen, Ylan (TW); Chia-Lin Chen, Hsinchu (TW); Ju-Wang Hsu, Taipei (TW); Tze-Liang Lee, Hsinchu (TW); Shih-Chang Chen, Hsin-Chu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 33 days.

(21) Appl. No.: 10/798,960

(22) Filed: Mar. 10, 2004

(65) Prior Publication Data

US 2005/0199958 A1    Sep. 15, 2005

(51) Int. Cl.
*H01L 21/8238* (2006.01)

(52) U.S. Cl. ................ 438/199; 438/202; 438/205; 438/581; 438/630

(58) Field of Classification Search ................ 438/199, 438/202, 205, 581, 630
See application file for complete search history.

(56) References Cited

U.S. PATENT DOCUMENTS 6,855,982 B1 * 2/2005 Xiang et al. ................ 257/330
6,890,808 B1 * 5/2005 Chidambarrao et al. .... 438/199

* cited by examiner

*Primary Examiner*—Mai-Huong Tran
(74) *Attorney, Agent, or Firm*—Tung & Assoc.

(57) ABSTRACT

A strained channel MOSFET device with improved charge mobility and method for forming the same, the method including providing a first gate with a first semiconductor conductive type and second gate with a semiconductor conductive type on a substrate; forming a first strained layer with a first type of stress on said first gate; and, forming a second strained layer with a second type of stress on said second gate.

36 Claims, 3 Drawing Sheets

METHOD FOR SELECTIVELY STRESSING MOSFETS TO IMPROVE CHARGE CARRIER MOBILITY

FIELD OF THE INVENTION

This invention generally relates to formation of MOSFET devices in integrated circuit manufacturing processes and more particularly to a method of selectively inducing stress (strain) into a MOSFET device to improve both electron and hole charge carrier mobility in respective MOSFET channel regions.

BACKGROUND OF THE INVENTION

Mechanical stresses are known to play a role in charge carrier mobility which affects Voltage threshold shifts. The effect of induced mechanical stresses, also referred to as strain in MOSFET device channel regions, on charge carrier mobility is believed to be influenced by complex physical processes related to acoustic and optical phonon scattering.

Generally, manufacturing processes are known to introduce stress into the MOSFET device channel region. For example, stress is typically introduced into the channel region by formation of an overlying polysilicon gate structure and silicide formation processes. In addition, ion implantation and annealing processes following formation of the gate structure typically introduce additional stresses into the polysilicon gate structure which are translated into the underlying channel region altering device performance.

Prior art processes have attempted to introduce offsetting stresses into the channel region by forming stressed dielectric layers over the polysilicon gate structure following a silicide formation process. These approaches have met with limited success, however, since the formation of the stressed dielectric layer typically has a degrading electrical performance effect, for example drive current, on a CMOS device formed to operate on the opposite type of majority charge carrier (e.g., N vs. P charge carrier). For example, as NMOS device performance is improved, PNMOS device performance is degraded.

Other shortcomings in prior art approaches are the adverse affect of the dielectric stress altering layer on subsequent gap filling ability of a subsequent inter-layer dielectric (ILD) layer deposition. For example, the thickness of the dielectric stress layer, and therefore stress altering influence, is limited due to the formation of narrower gaps between devices, a limitation that will increase as device sizes and gap sizes between devices decreases.

These and other shortcomings demonstrate a need in the semiconductor device integrated circuit manufacturing art for improved CMOS device manufacturing methods to control a mechanical stress level in CMOS device channel regions to improve device performance and reliability.

It is therefore an object of the present invention to provide improved CMOS device manufacturing methods to control a mechanical stress level in CMOS device channel regions to improve device performance and reliability, in addition to overcoming other shortcomings of the prior art.

SUMMARY OF THE INVENTION

To achieve the foregoing and other objects, and in accordance with the purposes of the present invention, as embodied and broadly described herein, the present invention provides a strained channel MOSFET device with improved charge mobility and method for forming the same.

In a first embodiment, the method includes providing a first gate with a first semiconductor conductive type and second gate with a semiconductor conductive type on a substrate; forming a first strained layer with a first type of stress on said first gate; and, forming a second strained layer with a second type of stress on said second gate.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to exemplary NMOS and PMOS devices, it will be appreciated that the method of the present invention may be applied to the formation of any MOSFET device where a stress level is controllably introduced into a charge carrier channel region by selective formation and subsequent removal of stressed dielectric layers overlying an NMOS and/or PMOS gate structure.

Figure 1A:
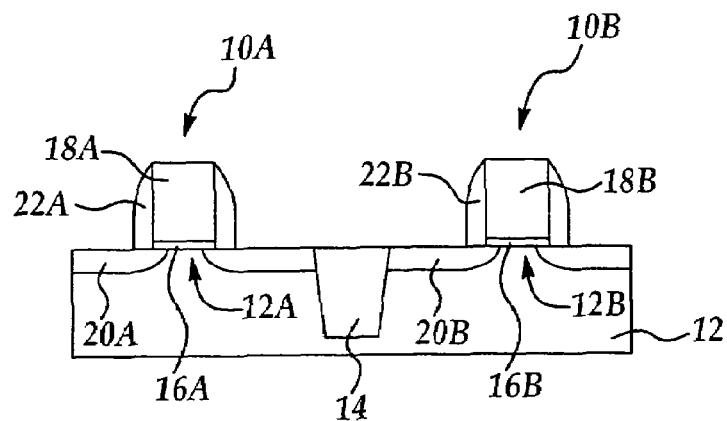
FIGS. 1A–1F are cross sectional schematic representations of exemplary portions of a CMOS device including NMOS and PMOS portions formed in parallel at stages of manufacture according to an embodiment of the present invention.

Referring to FIGS. 1A–1F in an exemplary embodiment of the method of the present invention, are shown cross-sectional schematic views of a portion of a semiconductor wafer during stages in production of CMOS structures including NMOS and PMOS devices 10A and 10B. For example, referring to FIG. 1A is shown a silicon substrate 12 including respective p-doped well regions 12A and n-doped well region 12B formed by conventional methods, for example a masking process followed by ion implantation and activation annealing. Formed by conventional processes prior to forming the n-well and p-well regions are isolation areas, for example shallow trench isolation (STI) structures, e.g., 14 back filled with an oxide dielectric, for example TEOS oxide.

Still referring to FIG. 1A, a gate structure is formed by conventional processes including first depositing a gate dielectric portion e.g., 16A and 16B followed by formation of a polysilicon layer and photolithographic patterning and plasma assisted etching e.g., an (RIE) process to form polysilicon gate electrode portions e.g., NMOS device polysilicon gate electrode 18A and PMOS device polysilicon gate electrode 18B. Following formation of the polysilicon gate electrodes, source/drain extension (SDE) regions forming a portion of doped S/D regions e.g., 20A and 20B are formed by a conventional ion implant process adjacent the polysilicon electrodes to a shallow depth e.g., (30 to 100 nm) beneath the silicon substrate surface according to a low energy ion implantation or plasma immersion doping process.

Still referring to FIG. 1A, sidewall spacers e.g., 22A and 22B, also referred to as dielectric offset spacers, are formed along the polysilicon gate electrode sidewalls by depositing one or more layers of silicon nitride (e.g., $Si_3N_4$), silicon oxynitride (e.g., SiON), or silicon oxide (e.g., $SiO_2$) over the gate dielectric followed by etching away portions of the one or more layers to form self-aligned sidewall spacers on either side of the polysilicon gate electrodes.

Following sidewall spacer formation, the NMOS and PMOS device areas are sequentially doped according to a conventional a high dose ion implantation (HDI) process to form the high density implant portions of doped source/drain (S/D) regions e.g., 20A and 20B in the silicon substrate adjacent the sidewall spacers. The polysilicon electrodes 18A and 18B are preferably doped at the same time the HDI is carried out to lower a sheet resistance of the polysilicon. The HDI process, carried out at higher implantation energies known in the art compared to the SDE ion implantations, preferably at least partially forms amorphous polysilicon in polysilicon electrodes 18A and 18B including the entire polysilicon electrode portion.

In one embodiment, an annealing process to activate the HDI treated S/D regions and the polysilicon electrodes is postponed until after the formation of overlying dielectric films in tensile stress and/or compressive stress over respective NMOS and PMOS gate structures as explained further below.

Figure 1B:
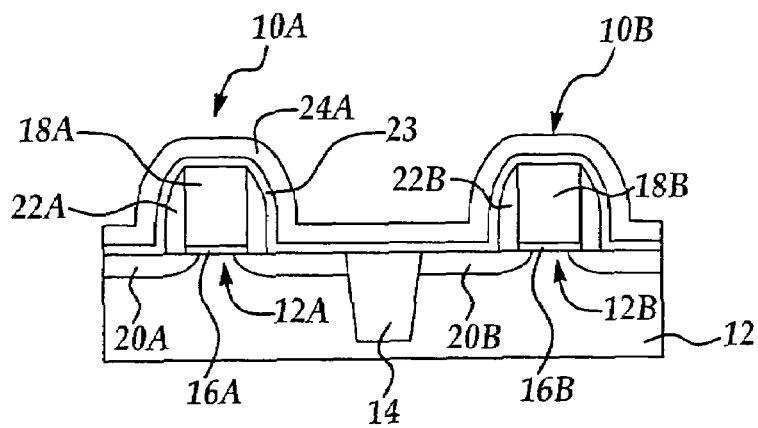

Referring to FIG. 1B, according to an important aspect of the invention, at least one first dielectric layer e.g., 24A is blanket deposited to cover the NMOS and PMOS structures formed in one of compressive and tensile stress to form a first strained layer. Prior to formation of the first dielectric layer 24A, optionally, but preferably to enhance a subsequent etch processes, a silicon oxide buffer layer e.g., 23 having a thickness of less than about 200 Angstroms is formed by a conventional CVD process over the NMOS and PMOS devices. It will be appreciated, as explained below, that the order of first depositing dielectric (strained) layers in either tensile (over NMOS device) or compressive stress (over PMOS device) may be reversed provided that a tensile stress dielectric layer is formed over the NMOS device portion and/or the compressive stress dielectric layer is formed over the PMOS device portion, prior to the dopant activation and polysilicon recrystallization annealing process.

In the exemplary embodiment as shown, the first dielectric layer 24A is deposited in tensile stress over both the NMOS device and PMOS devices. For example, the first dielectric layer is deposited to be in tensile stress, having a tensile stress, preferably of up to about 2 GPa. It will be appreciated that the level of the tensile stress can be varied by a number of factors including the thickness of the dielectric film, preferably being from about 50 Angstroms to about 1000 Angstroms in thickness. In a preferred embodiment, the dielectric film 24A is deposited by a CVD process where the relative reactant flow rates, deposition pressure, and temperature may be varied to vary a composition of the dielectric layer thereby controlling the level of either tensile or compressive stress. For example, the dielectric film may be a nitride film, preferably including silicon nitride (e.g., SiN, $Si_xN_y$) or silicon oxynitride (e.g., $Si_xON_y$) where the stoichiometric proportions x and y may be selected according to CVD process variables as are known in the art to achieve a desired tensile or compressive stress in a deposited dielectric layer. For example, the CVD process may be a low pressure chemical vapor deposition (LPCVD) process, an atomic layer CVD (ALCVD) process, or a plasma enhanced CVD (PECVD) process.

According to an aspect of the invention the first dielectric layer 24A is deposited at a temperature lower than a recrystallization temperature of the amorphous polysilicon gate electrode 18A and 18B portions formed in the HDI process. For example, although the precise recrystallization temperature is dependent on the level and type of doping, deposition at a temperature of less than about 600° C. is generally sufficient to prevent recrystallization of the amorphous polysilicon gate electrode portions. Conventional CVD precursors such as, silane ($SiH_4$), disilane ($Si_2H_6$) dichlorosilane ($SiH_2Cl_2$), hexacholorodisilane ($Si_2Cl_6$), BTBAS and the like, may be advantageously used in the CVD process to form the first dielectric layer.

For example, a low temperature LPCVD process for forming a tensile stress nitride dielectric layer includes supplying hexacholorodisilane (HCD) ($Si_2Cl_6$) and $NH_3$ gaseous precursors deposited at a temperature of from about 400° C. to about 600° C. at a pressure of about 0.1 Torr to about 10 Torr mTorr. An $NH_3$ to HCD volumetric gas ratio is from about 0.1 to about 500 with a stress increasing with an increasing volumetric ratio.

For example, a low temperature PECVD process for forming a compressive stress nitride layer may include supplying silane ($SiH_4$) and $NH_3$ gaseous precursors at a deposition temperature of from about 300° C. to about 600° C. carried out at pressures of from about 50 mTorr to about 5 Torr and RF powers of from about 100 Watts to about 3000 Watts. The RF power frequency is from about 50 KHz to about 13.56 MHz. Compressive stress increases with increasing power and frequency.

Figure 1C:
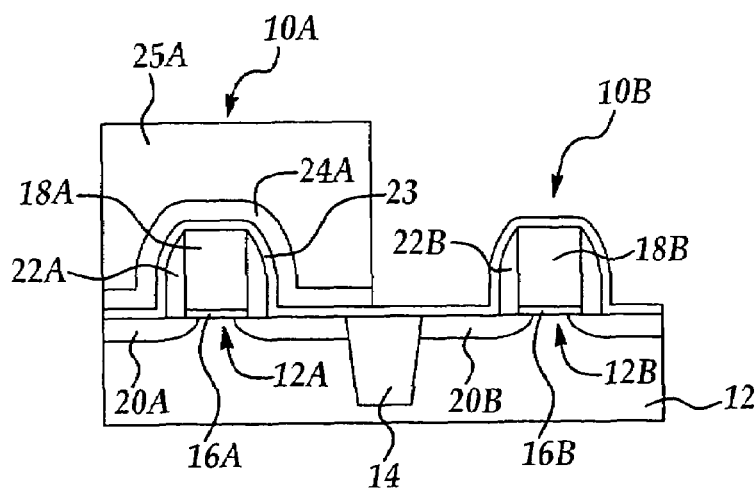

Referring to FIG. 1C, following formation of the first dielectric layer 24A, a resist patterning process is carried out to cover one of the NMOS and PMOS device portions and remove the first dielectric layer remaining exposed over the uncovered portion. For example, in the exemplary order of processing steps shown, a protective resist covering 25A is formed over the NMOS device portion 10A and the first dielectric layer 24A formed in tensile stress is removed over the PMOS device portion 10B, e.g., including over about half the width of the STI feature 14 by a conventional wet etching (e.g., HF or hot $H_3PO_4$) or dry etching process.

At this point, an annealing process is optionally carried out to simultaneously activate the HDI dopants in the polysilicon gate electrodes 18A and 18B and S/D regions e.g., 20A and 20B as well as recrystallize the amorphous polysilicon gate electrode portions formed in the HDI process. For example, the annealing process is preferably carried out at temperatures greater than about 600° C., more preferably greater than about 900° C. by conventional annealing techniques. During the annealing process and recrystallization of the amorphous polysilicon portions, the stressed (strained) dielectric layer e.g., 24A enhances a stress, e.g., tensile stress imparted to the respective channel region e.g., 12A while not affecting (enhancing) the stress (e.g., compressive) imparted to the channel region of the device (e.g., PMOS) having the stressed dielectric layer first removed, thereby enhancing electron mobility in the NMOS device while not degrading electron mobility in the PMOS device.

It will be appreciated that a compressive stress dielectric layer may be first formed over the NMOS and PMOS devices 10A and 10B followed by removal of that portion of the compressive stress dielectric layer overlying the NMOS device 10A portion followed by an annealing process to impart an enhanced compressive stress to the PMOS channel 10B portion e.g., 12B to enhance hole mobility, while not degrading electron mobility in the NMOS device.

In one embodiment, following the annealing process, the remaining portion of the first dielectric layer 24A overlying the NMOS device 10A and the oxide buffer layer 23 over both NMOS and PMOS devices may be removed, for example by sequential wet etching (e.g., hot $H_3PO_4$ dip) or dry etching, followed by a dilute HF wet etching solution dip to remove remaining portions of the oxide buffer layer 23.

Figure 1D:
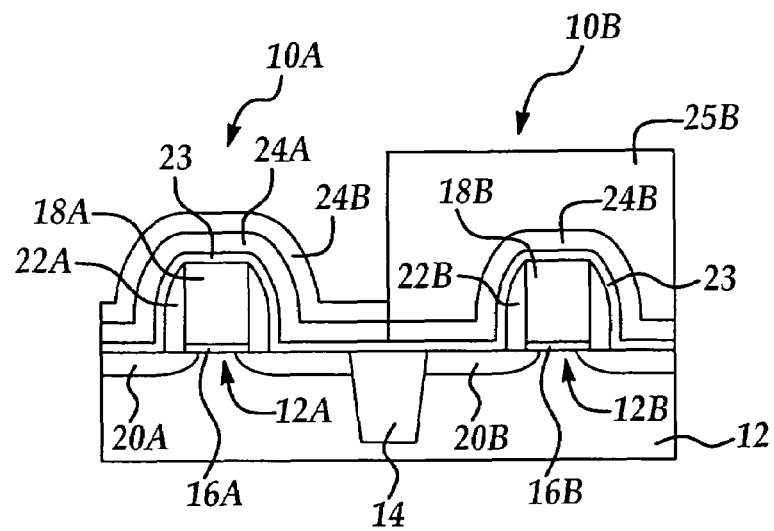

Referring to FIG. 1D, in another embodiment, following removal of a portion of the first dielectric layer 24A (e.g., in tensile stress over the PMOS device 10B), at least one second strained (stressed) dielectric layer 24B is formed over the NMOS device 10A and PMOS device 10B according to preferred embodiments as outlined for the first dielectric layer 24A, but now preferably formed in an opposite stress relationship, e.g., compressive stress up to about 2 GPa.

Figure 1E:
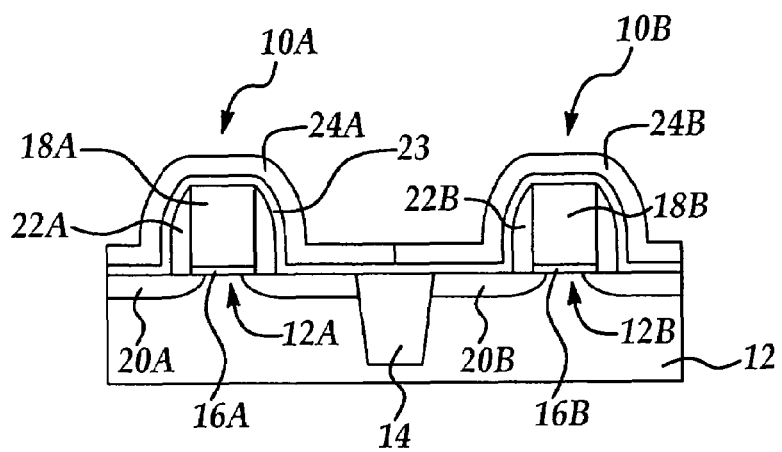

Referring to FIG. 1E, a second protective resist layer 25B is then deposited to cover and protect the PMOS device 10B portion while a portion of the second dielectric layer 24B overlying the NMOS device portion 10A is removed according to a conventional wet or dry etching process as previously outlined for dielectric layer portion 24A. For example, for a silicon nitride containing second dielectric layer 24B, a wet etching process including HF and/or hot $H_3PO_4$, or a fluorocarbon and/or hydrofluorocarbon containing dry etching chemistry.

At this point, after forming a respective tensile stress dielectric layer e.g., 24A over the NMOS device and a compressive stress dielectric layer e.g., 24B over the PMOS device, an annealing process is not necessary if the respective dielectric layers will remain in place to form a protective layer, e.g., a contact etching stop layer in subsequent processes. On the other hand, if the stressed dielectric layers 24A and 24B are desired to be removed to improve a subsequent gap filling process, prior to removal, an annealing process, similar to that previously outlined is preferably carried out to recrystallized amorphous polysilicon portions with the respective stressed dielectric layers in place over one or both of the NMOS and PMOS devices to transfer a stress to the channel region to form a strained channel thereby improving the charge carrier mobility in at least one and preferably both NMOS and PMOS devices.

Advantageously, following formation of the respective tensile stress and compressive stress dielectric layers, e.g., 24A and 24B are left in place to serve as both stressors and as protective layers in subsequent manufacturing processes.

Figure 1F:
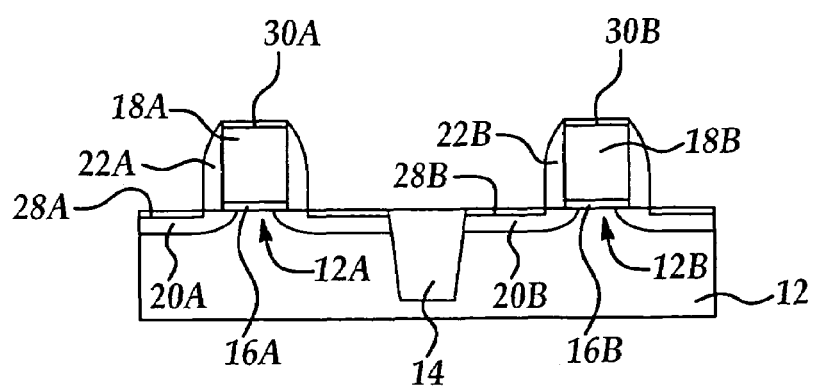

Referring to FIG. 1F, in a another embodiment, if the dielectric layer portions 24A and 24B are removed, and oxide buffer layer 23, conventional processes may then carried out to complete formation of the NMOS and PMOS MOSFET devices including forming salicide (self aligned silicide) portions over the source and drain regions e.g., 28A and 28B, and silicide over the upper portion of the polysilicon electrodes, e.g., 30A and 30B. For example, $TiSi_2$ or $CoSi_2$ silicides are formed by conventional processes including titanium or cobalt deposition followed by silicide formation and annealing processes to achieve the low electrical resistance silicide phase as is known in the art.

Figure 2:
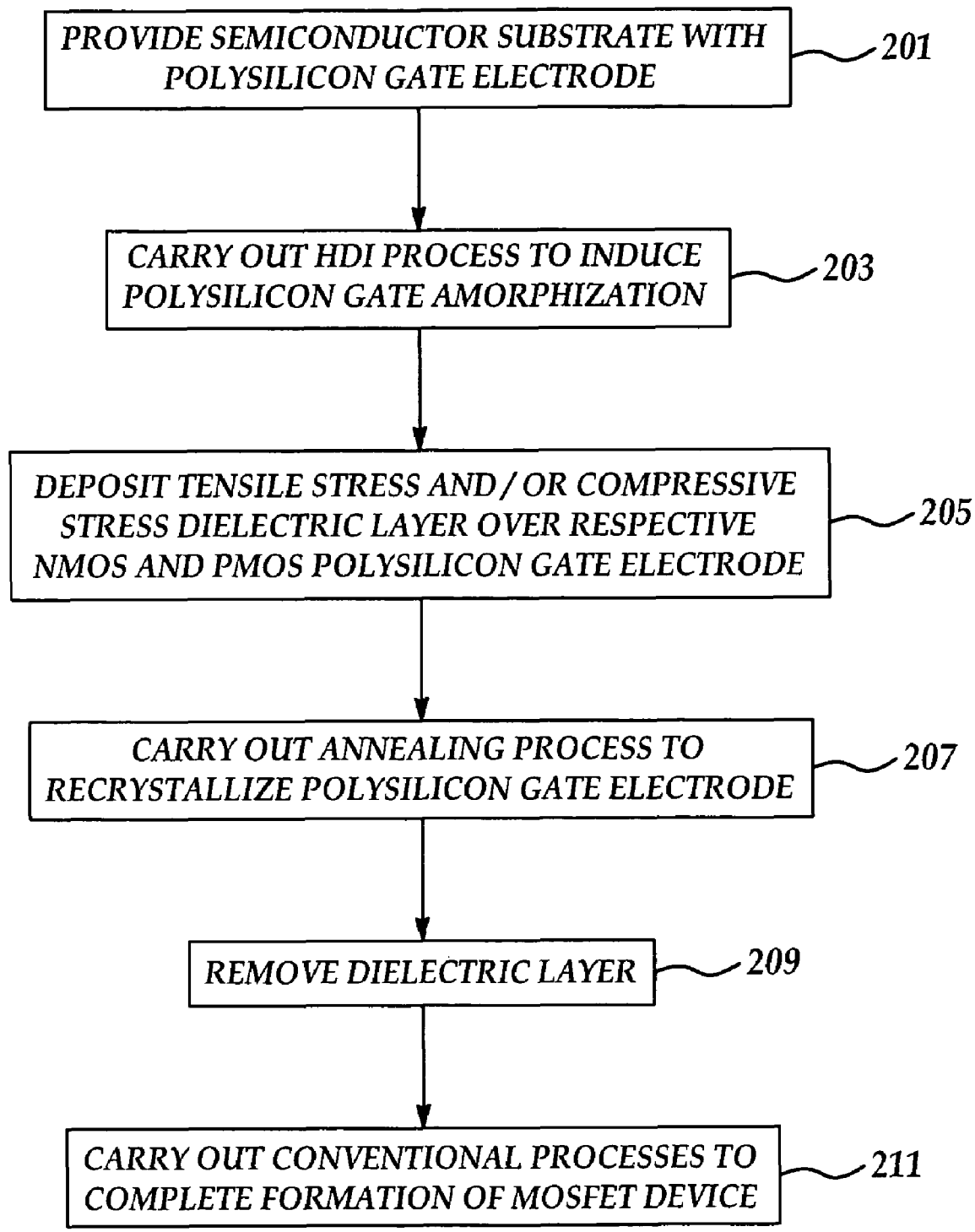
FIG. 2 is an exemplary process flow diagram including several embodiments of the present invention.

Referring to FIG. 2 is a process flow diagram including several embodiments of the present invention. In process 201, a an semiconductor substrate including a polysilicon gate electrode is provided. In process 203 a high density implant (HDI) doping process is carried out inducing polysilicon gate electrode amorphization. In process 205, at least one dielectric layer in tensile and/or compressive stress over respective NMOS and PMOS polysilicon electrodes (i.e., tensile stress over NMOS and/or compressive stress over PMOS). In process 207, an annealing process is carried out to activate the HDI dopants and recrystallize the polysilicon gate electrodes forming a desired stress in the semiconductor substrate. In process 209, the at least one dielectric layer is removed. In process 211, conventional processes are carried out to complete formation of MOSFET devices.

Thus a method has been presented for selectively delivering a selected stress level and type to a MOSFET channel region to improve charge carrier mobility and device performance. Among the several advantages of the invention include the fact that the stressed dielectric layer may be deposited at higher temperatures since the deposition temperature is limited by a temperature of amorphous polysilicon recrystallization rather than another phase transformation such as a previously formed silicides. Further, since the HDI dopant activation is carried out following formation of the stressed dielectric layer, the temperature of dielectric layer formation does not contribute to dopant deactivation. Moreover, an embodiment of the method of the present invention allows the simultaneous formation of a desired level and type of stress in both PMOS and NMOS devices to improve both hole and electron charge carrier mobility, respectively.

Other realized advantages include the fact that the stressed dielectric layers may be removed following the stressed channel enhancing process thereby avoiding process window limitations including gap filling ability in a subsequent ILD layer deposition process. Alternatively, portions of the stressed dielectric layers may be left in place to serve as both stressors and protective layers without the necessity of additional formation processes. Advantageously, the method is cost efficient in that the same photomask used for respective NMOS and PMOS HDI processes may be used to selectively remove stressed dielectric layer portions followed by formation of stressed dielectric layer over respective NMOS and PMOS devices.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for improving charge mobility in a MOSFET device comprising the steps of:
    providing a first gate with a first semiconductor conductive type and a second gate with a second semiconductor conductive type overlying a substrate;
    forming a first strained layer with a first type of stress overlying said first gate including gate sidewall portions; and,
    forming a second strained layer with a second type of stress overlying said second gate including gate sidewall portions.

2. The method of claim 1, further comprising the step of transferring the first stress type from the first strained layer to the first gate and the second stress type from the second strained layer to the second gate, said transfer comprising an annealing process.

3. The method of claim 1, further comprising the step of removing the first and second strained layers.

4. The method of claim 1, wherein an oxide layer is formed over the first and second gates including gate sidewall portions and underlying first and second strained layers.

5. The method of claim 1, wherein an ion implantation process to form dopant regions including forming an amorphous portion in the first and second gates is performed prior to the steps of forming a first and second strained layer.

6. The method of claim 5, further comprising the step of carrying out an annealing process to recrystallize the amorphous portion following the steps of forming a first and second strained layer.

7. The method of claim 1, wherein the first and second stress types are selected from the group consisting of tensile stress and compressive stress formed over a respective N conductive type gate and P conductive type gate.

8. The method of claim 1, wherein the steps of forming a first and second strained layer comprise the steps of:
    forming the first strained layer;
    removing a first portion of the first strained layer including gate sidewall portions over one of the first and second gates to leave an uncovered portion; and,
    forming the second strained layer over the uncovered portion including gate sidewall portions.

9. The method of claim 1, wherein the first and second strained layers are deposited by a CVD process selected from the group consisting of LPCVD, ALCVD, and PECVD.

10. The method of claim 1, wherein the first and second strained layers comprise a nitride.

11. The method of claim 1, wherein the wherein the first and second strained layers are selected from the group consisting of silicon nitride and silicon oxynitride.

12. The method of claim 1, wherein the wherein the first and second strained layers comprise a stress level up to about 2 GPa.

13. The method of claim 1, wherein the first and second strained layers are formed at a thickness from about 50 Angstroms to about 1000 Angstroms.

14. The method of claim 1, wherein the steps of forming the first and second strained layers is carried out at a temperature less than about 600° C.

15. The method of claim 1, wherein the first and second strained layers are formed without filling a gap between the first and second gate.

16. The method of claim 1, wherein the first and second strained layers are formed without a silicide region present.

17. A method for improving charge mobility in a MOSFET device comprising the steps of:
    providing a first gate with a first semiconductor conductive type and a second gate with a second semiconductor conductive type overlying a substrate;
    forming a first strained dielectric layer with a first type of stress overlying said first gate;
    forming a second strained dielectric layer with a second type of stress overlying said second gate;
    transferring the first stress type from the first strained dielectric layer to the first gate and the second stress type from the second strained dielectric layer to the second gate; and,
    removing the first and second strained dielectric layers.

18. The method of claim 17, wherein the first and second strained dielectric layers are formed without filling a gap between the first and second gate.

19. The method of claim 17, wherein the first and second strained dielectric layers are over gate sidewall portions.

20. The method of claim 17, wherein the first and second strained dielectric layers are formed without a silicide region present.

21. A method for improving charge mobility in a MOSFET device comprising the steps of:
    providing a substrate comprising at least one polysilicon gate electrode;
    performing an ion implantation process to form dopant regions including forming an amorphous portion in the at least one polysilicon gate electrode;
    forming a first dielectric layer comprising a selected stress level selected from the group consisting of tensile stress and compressive stress over the at least one polysilicon gate electrode including gate sidewall portions without filling a gap with respect to an adjacent gate electrode; and,
    carrying out an annealing process to recrystallize the amorphous portions of the respective polysilicon gate electrodes to form a stress level in the substrate.

22. The method of claim 21, wherein the first dielectric layer is formed without a silicide region present.

23. A method for improving charge mobility in a MOSFET device comprising the steps of:
    providing a substrate comprising at least one polysilicon gate electrode;
    performing an ion implantation process to form dopant regions including forming an amorphous portion in the polysilicon gate electrode; and,
    forming at least one dielectric layer comprising a selected stress level selected from the group consisting of tensile stress and compressive stress over the at least one polysilicon gate electrode including gate sidewall portions, said at least one dielectric layer formed without a silicide region present and without filling a gap with respsect to an adjacent gate electrode.

24. The method of claim 23, further comprising carrying out an annealing process to recrystallize the amorphous portion and activate the dopant regions while forming a stress level in the substrate.

25. The method of claim 23, wherein the step of forming a dielectric layer further comprises forming an underlying oxide layer.

26. The method of claim 23, wherein the step of forming at least one dielectric layer comprises forming a dielectric layer in tensile stress over an N-type polysilicon gate electrode and a dielectric layer in compressive stress over a P-type polysilicon gate electrode.

27. The method of claim 26, comprising the steps of:
forming a first dielectric layer comprising a first stress type selected from the group consisting of tensile and compressive stress;
removing a first portion of the first dielectric layer over one of the N-type and P-type polysilicon gate electrodes including gate sidewall portions; and
forming a second dielectric layer comprising a second stress type opposite from the first stress type over the first portion including gate sidewall portions.

28. The method of claim 23, wherein the at least one dielectric layer is formed by a CVD process selected from the group consisting of LPCVD, ALCVD, and PECVD.

29. The method of claim 23, wherein the at least one dielectric layer comprises a nitride.

30. The method of claim 23, wherein the at least one dielectric layer is selected from the group consisting of silicon nitride and silicon oxynitride.

31. The method of claim 23, wherein the stress level is formed at up to about 2 GPa.

32. The method of claim 23, wherein the at least one dielectric layer is formed at a thickness from about 50 Angstroms to about 1000 Angstroms.

33. The method of claim 23, further comprising the step of removing at least a portion of the least one dielectric layer.

34. The method of claim 33, further comprising the step of forming a silicide region in the uppermost portion of the polysilicon gate electrode.

35. The method of claim 23, wherein the step of forming the at least one dielectric layer is carried out at a temperature less than a recrystallization temperature of the amorphous portion.

36. The method of claim 23, wherein the step of forming at least one dielectric layer is carried out at a temperature less than about 600° C.

* * * * *